(12) United States Patent
Heo et al.

(10) Patent No.: US 8,536,778 B2
(45) Date of Patent: Sep. 17, 2013

(54) DUAL PANEL TYPE ORGANIC ELECTROLUMINESCENT DISPLAY DEVICE AND METHOD OF FABRICATING THE SAME

(75) Inventors: Jung-Soo Heo, Gyeongbuk (KR); Jae-Hee Park, Daegu (KR); Sang-Ho Yu, Seongnam-si (KR); Kyung-Min Park, Gumi-si (KR); Sung-Hoon Choi, Bucheon-si (KR); Seok-Jong Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 111 days.

(21) Appl. No.: 13/040,936

(22) Filed: Mar. 4, 2011

(65) Prior Publication Data
US 2011/0156573 A1 Jun. 30, 2011

Related U.S. Application Data

(62) Division of application No. 11/639,310, filed on Dec. 15, 2006, now Pat. No. 7,923,916.

(30) Foreign Application Priority Data

Jun. 30, 2006 (KR) .................. 10-2006-0060861

(51) Int. Cl.
*H01L 51/52* (2006.01)
(52) U.S. Cl.
USPC ............................ 313/504; 445/25; 313/506
(58) Field of Classification Search
USPC .................................. 313/504, 506; 445/24
See application file for complete search history.

(56) References Cited

U.S. PATENT DOCUMENTS

| | | | |
|---|---|---|---|
| 6,046,543 A | 4/2000 | Bulovic et al. | |
| 6,366,017 B1 | 4/2002 | Antoniadis et al. | |
| 6,876,406 B2 | 4/2005 | Hwang | |
| 6,917,159 B2 * | 7/2005 | Tyan et al. | 313/506 |
| 2002/0051894 A1 * | 5/2002 | Yoshikawa | 428/690 |
| 2003/0052597 A1 | 3/2003 | Sakurai | |
| 2003/0116772 A1 | 6/2003 | Yamazaki et al. | |
| 2003/0127650 A1 | 7/2003 | Park et al. | |
| 2003/0173564 A1 * | 9/2003 | Ko et al. | 257/40 |
| 2003/0193284 A1 * | 10/2003 | Park et al. | 313/504 |
| 2005/0051770 A1 | 3/2005 | Ando et al. | |
| 2005/0110016 A1 | 5/2005 | Yamazaki | |
| 2005/0140285 A1 | 6/2005 | Park et al. | |
| 2005/0236956 A1 | 10/2005 | Chung et al. | |
| 2006/0035015 A1 | 2/2006 | Raychaudhuri et al. | |
| 2006/0102910 A1 | 5/2006 | Yamazaki et al. | |

FOREIGN PATENT DOCUMENTS

| | | |
|---|---|---|
| CN | 1623117 A | 6/2005 |
| DE | 10 2004 031 109 A1 | 4/2006 |
| JP | 2004-048036 A | 2/2004 |
| JP | WO 2005-175248 A | 6/2005 |
| JP | 2006-156369 A | 6/2006 |
| TW | 200536434 | 11/2005 |
| WO | 2005/024956 A1 | 3/2005 |

* cited by examiner

*Primary Examiner* — Mary Ellen Bowman
(74) *Attorney, Agent, or Firm* — Birch, Stewart, Kolasch & Birch, LLP

(57) ABSTRACT

An organic electroluminescent device including a switching element and a driving element connected to the switching element on a substrate including a pixel region, a cathode connected to the driving element, in which the cathode includes molybdenum (Mo), an emitting layer on the cathode, and an anode on the emitting layer.

5 Claims, 22 Drawing Sheets

DUAL PANEL TYPE ORGANIC ELECTROLUMINESCENT DISPLAY DEVICE AND METHOD OF FABRICATING THE SAME

This application is a Divisional of application Ser. No. 11/639,310, filed on Dec. 15, 2006 now U.S. Pat. No. 7,923,916, which claims priority to Korean Patent Application No. 10-2006-0060861 filed in Korea on Jun. 30, 2006. The entire contents of all of the above applications are hereby incorporated by reference.

BACKGROUND OF THE INVENTION

1. Field of the Invention

The present invention relates to an organic electroluminescent device (OELD), and more particularly to a top emission type OELD having a high brightness.

2. Discussion of the Related Art

In general, an OELD emits light by injecting electrons from a cathode and holes from an anode into an emission layer, combining the electrons with the holes, generating an exciton, and transitioning the exciton from an excited state to a ground state. In comparison to a liquid crystal display (LCD) device, an additional light source is not necessary for the OELD to emit light, because the transition of the exciton between the two states causes light to be emitted. Accordingly, the size and weight of the OELD are less than the LCD device.

The OELD has other excellent characteristics, such as a low power consumption, superior brightness, and a fast response time. Thus, the OELD is seen as the display for the next-generation of consumer electronic applications such as cellular phones, car navigation systems (CNSs), personal digital assistants (PDAs), camcorders, palmtop computers, etc. Moreover, because fabricating the organic ELD is performed with fewer processing steps, the OELD is less expensive to produce than the LCD device.

In addition, the two types of OELDs are a passive matrix OELD and an active matrix OELD. While both of the passive and active matrix OELDs have a simple structure and are formed by a simple fabricating process, the passive matrix OELD requires a relatively large amount of power to operate. In addition, the display size of the passive matrix OELD is limited by the width and thickness of conductive lines used in the structure. Further, as the number of conductive lines increases, the aperture ratio of the passive matrix OELD decreases. In contrast, the active matrix OELDs are highly efficient and can produce a high-quality image on a large display with a relatively low power.

Turning now to FIG. 1, which is a schematic cross-sectional view of an OELD 1 according to the related art. As shown, the OELD 1 includes first and second substrates 12 and 28 facing and being spaced apart from each other. Also included is an array element layer 14 formed on the first substrate 12. As shown, the array element layer 14 includes a thin film transistor "T." Although not shown, the array element layer 14 further includes a gate line, a data line crossing the gate line to define a pixel region "P," and a power line crossing one of the gate and data lines. In addition, the OELD 1 also includes a first electrode 16 on the array element layer 14, an organic electroluminescent (EL) layer 18 on the first electrode 16, and a second electrode 20 on the organic EL layer 18. In addition, the first electrode 16 is connected to the thin film transistor "T." Here, the organic EL layer 18 includes red (R), green (G) and blue (B) sub-organic EL layers in the pixel regions "P."

In addition, the second substrate 28 functions as an encapsulating panel having a receded portion 21. A desiccant 22 is packaged in the receded portion 21 to protect the OELD 1 from moisture. Further, a seal pattern 26 is formed between the first and second substrates 12 and 28 in a periphery thereof so as to attach the first and second substrates 12 and 28 to each other.

Next, FIG. 2 is an equivalent circuit diagram of the related art ELD shown in FIG. 1. As shown in FIG. 2, a pixel region "P" is defined by a gate line 42 and a data line 44 crossing the gate line 42 formed on a substrate 32. Also included is a power line 55 spaced parallel from the gate line 42 and crossing the data line 44.

In addition, a switching element "$T_S$" is connected to the gate and data lines 42 and 44 at an adjacent portion crossing the gate and data lines 42 and 44 and a driving element "$T_D$" is connected to the switching element "$T_S$." For example, the driving element "$T_D$" in FIG. 2 is a positive type thin film transistor. Further, a storage capacitor "$C_{ST}$" is formed between the switching element "Ts" and the driving element "$T_D$." Also, a drain electrode 63 of the driving element "$T_D$" is connected to a first electrode (not shown) of an organic EL diode "E." In addition, a source electrode 66 of the driving element "$T_D$" is connected to the power line 55 and a gate electrode 68 is connected to the capacitor Cst and switching element Ts.

Hereinafter, an operation of the OELD will be explained in detail. When a gate signal is applied to the gate electrode 46 of the switching element "Ts," a current signal applied to the data line 44 is changed into a voltage signal through the switching element "Ts" and is applied to the gate electrode 68 of the driving element "$T_D$."

Therefore, the driving element "$T_D$" is driven and the level of the current applied to the organic EL diode "E" is determined such that the organic EL diode "E" can embody a gray scale. Further, because the signal in the storage capacitor "Cst" functions to maintain the signal of the gate electrode 68 of the driving element "$T_D$," the current applied to the EL diode is maintained until the next signal is applied even if the switching element "Ts" is in an OFF state.

Next, FIG. 3 is a schematic plan view of a related art OELD with respect to one pixel. As shown, the switching element "Ts," the driving element "$T_D$" connected to the switching element "Ts," and the storage capacitor "Cst" are formed on the substrate 32 in the pixel region "P." Alternatively, the switching element "Ts" and the driving element "$T_D$" can be formed in multiple in the pixel region "P" in accordance with an operation characteristic thereof.

In addition, the substrate 32 includes a transparent insulating substrate such as glass or a plastic substrate. The gate line 42 is formed on the substrate 32 and the data line 44 crosses the gate line 42 to define the pixel region "P." In addition, in this example, a power line 55 is parallel to the data line 44.

Further, the switching element "Ts" includes the gate electrode 46 connected to a first gate line 42, a first semiconductor layer 50 over the first gate electrode 46, a first source electrode 56 connected to the data line 44, and a first drain electrode 60 spaced apart from the first source electrode 56. The driving element "$T_D$" includes the second gate electrode 68 connected to the drain electrode 60, a second semiconductor layer 62 over the second gate electrode 68, the second source electrode 66 connected to the power line 55, and the second drain electrode 63. Specifically, the first drain electrode 60 and the gate electrode 68 are connected to each other via a contact hole 64 of an insulating material layer (not shown).

Further, a first electrode 36 is connected to the first drain electrode 63 in the pixel region "P." Although not shown, the storage capacitor "Cst" includes a first storage electrode of doped silicon, a second storage electrode occupying a portion of the power line 55, and an insulating material layer (not shown) between the first and second storage electrodes.

Turning now to FIG. 4, which is a schematic cross-sectional view of the related art OELD taken along the "IV-IV" line in FIG. 3. In FIG. 4, the second semiconductor layer 62 is formed on the substrate 32, a gate insulating layer "GI" is formed on the second semiconductor layer 62, the gate electrode 68 is formed on the gate insulating layer "GI" over the second semiconductor layer 62, and an interlayer insulating layer "IL" is formed on the gate electrode 68 and includes first and second contact holes "C1" and "C2" that expose both end portions of the second semiconductor layer 62. The source and drain electrodes 66 and 63 are formed on the interlayer insulating layer "IL" and are connected to the second semiconductor layer 62 via the first and second contact holes "C1" and "C2."

A passivation layer 68 is also formed on the second source and drain electrodes 66 and 63 and includes a drain contact hole "C3" that exposes a portion of the drain electrode 63. The first electrode 36 is connected to the drain electrode 63 via the drain contact hole "C3," the organic EL layer 38 is formed on the first electrode 36, and a second electrode 80 is formed on the organic EL layer 38. The first electrode 36, the organic EL layer 38, and the second electrode 80 constitute the organic EL diode "E." Further, the driving element "$T_D$" is a negative type TFT, and the first electrode 36 and the second electrode 80 are a cathode and an anode, respectively. Alternatively, the driving element "$T_D$" is a positive type TFT, and the first electrode 36 and the second electrode 80 are an anode and a cathode, respectively.

In addition, the storage capacitor "Cst" and the driving element "$T_D$" are disposed in a row. Here, the source electrode 66 is connected to the second storage electrode, and the first storage electrode 35 is disposed under the second storage electrode 34.

FIG. 5 is a schematic cross-sectional view of an emission region of the related art. In FIG. 5, the emission region of the OELD 1 includes the anode 36 on the substrate 32, a hole injection layer 38a on the anode 36, a hole transport layer 38b on the hole injection layer 38a, an emitting layer 38c on the hole transport layer 38b, an electron transport layer 38d on the emitting layer 38c, an electron injection layer 38e on the electron transport layer 38d, and the cathode 80 on the electron injection layer 38e. These layers are sequentially layered on the anode 36.

In addition, the hole transport layer 38b and the electron transport layer 38d function to transport a hole and electron to the emitting layer 38c to improve an emitting efficiency. Further, the hole injection layer 38c between the anode 36 and the hole transport layer 38b function to reduce a hole injecting energy, and the electron injection layer 38e between the cathode 80 and the electron transport layer 38d function to reduce an electron injecting energy, thereby increasing the emitting efficiency and reducing the driving voltage of the OELD.

Further, the cathode 80 is formed of a material including calcium (Ca), aluminum (Al), magnesium (Mg), silver (Ag) and lithium (Li). In addition, the anode 36 includes a transparent conductive material such as indium tin oxide (ITO). Thus, because the anode 36 formed with a transparent conductive material such as ITO is deposited by sputtering, layers under the anode 36 may be damaged. Therefore, to prevent damaging the emitting layer 38, the anode 36 is not formed on the emitting layer 38.

Accordingly, when light from the emitting layer 38 is emitted toward the anode 36 formed under the emitting layer 38, the substantial aperture region is limited due to the array element (not shown) under the anode 36. Consequently, because the OELD related art is a bottom emission type OELD, the brightness is deteriorated due to the array element. Further, to minimize the aperture region, the design of the array element is limited. Also, the driving element is selected from a positive type poly-silicon type in connection with the structure of the organic EL diode, the array process is complicated and the product yield is reduced.

SUMMARY OF THE INVENTION

Accordingly, one object of the present invention is to address the above-noted and other problems.

Another object of the present invention is to provide an OELD and a method of fabricating the same that can be driven as a top emission type OELD with an improved brightness.

Yet another object of the present invention is to provide an OELD and a method of fabricating the same that includes an array element formed through a simple process that reduces the product cost.

Another object of the present invention is to provide an OELD and a method of fabricating the same that prevents oxidation of the cathode to thereby prevent a driving defect of the OELD.

To achieve these and other advantages and in accordance with the purpose of the present invention, as embodied and broadly described herein, the present invention provides in one aspect an organic electroluminescent device including a switching element and a driving element connected to the switching element on a substrate including a pixel region, a cathode connected to the driving element, in which the cathode includes molybdenum (Mo), an emitting layer on the cathode, and an anode on the emitting layer.

In another aspect, the present invention provides a method of fabricating an organic electroluminescent device including forming a switching element and a driving element connected to the switching element on a substrate including a pixel region, forming and connecting a cathode to the driving element, in which the cathode includes molybdenum (Mo), forming an emitting layer on the cathode, and forming an anode on the emitting layer. The present invention also provides a method of fabrication OELD devices.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
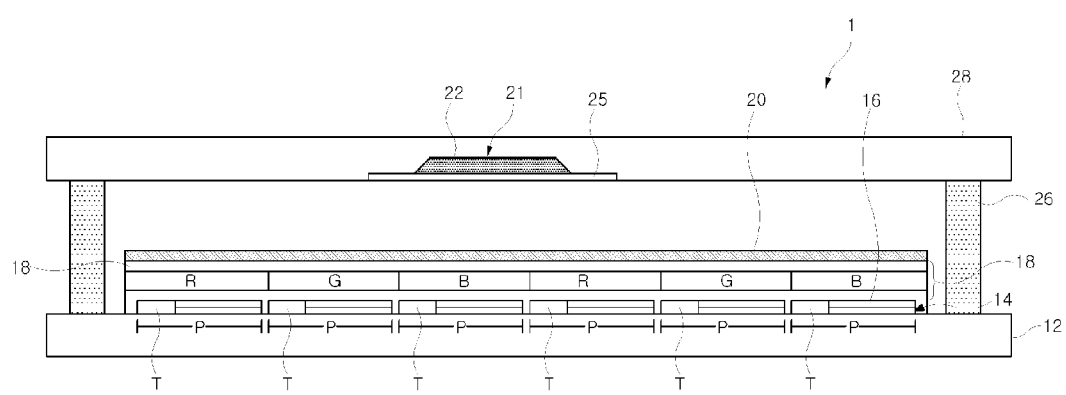
FIG. 1 is a schematic cross-sectional view of a related art OELD.
Figure 2:
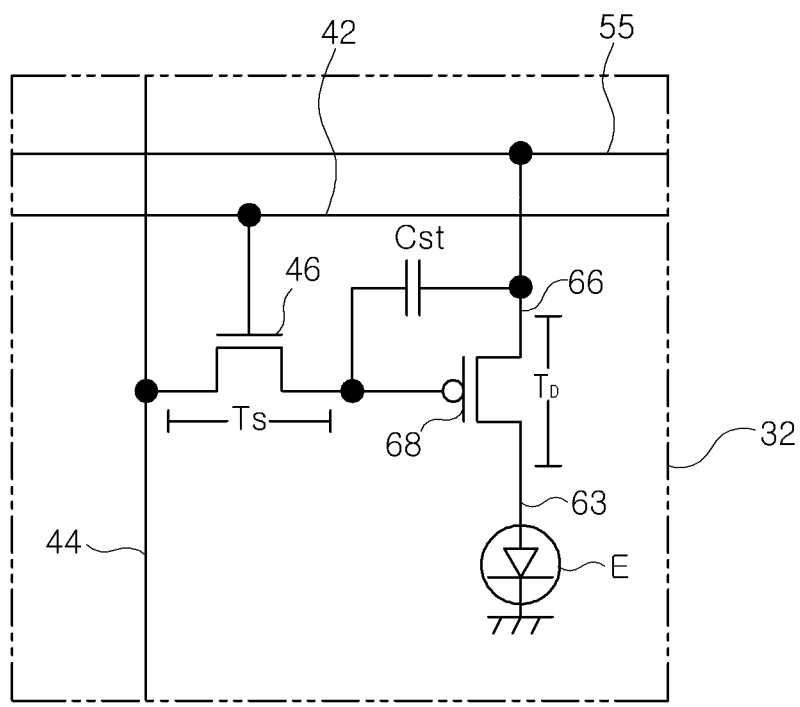
FIG. 2 is an equivalent circuit diagram of the related art OELD.
Figure 3:
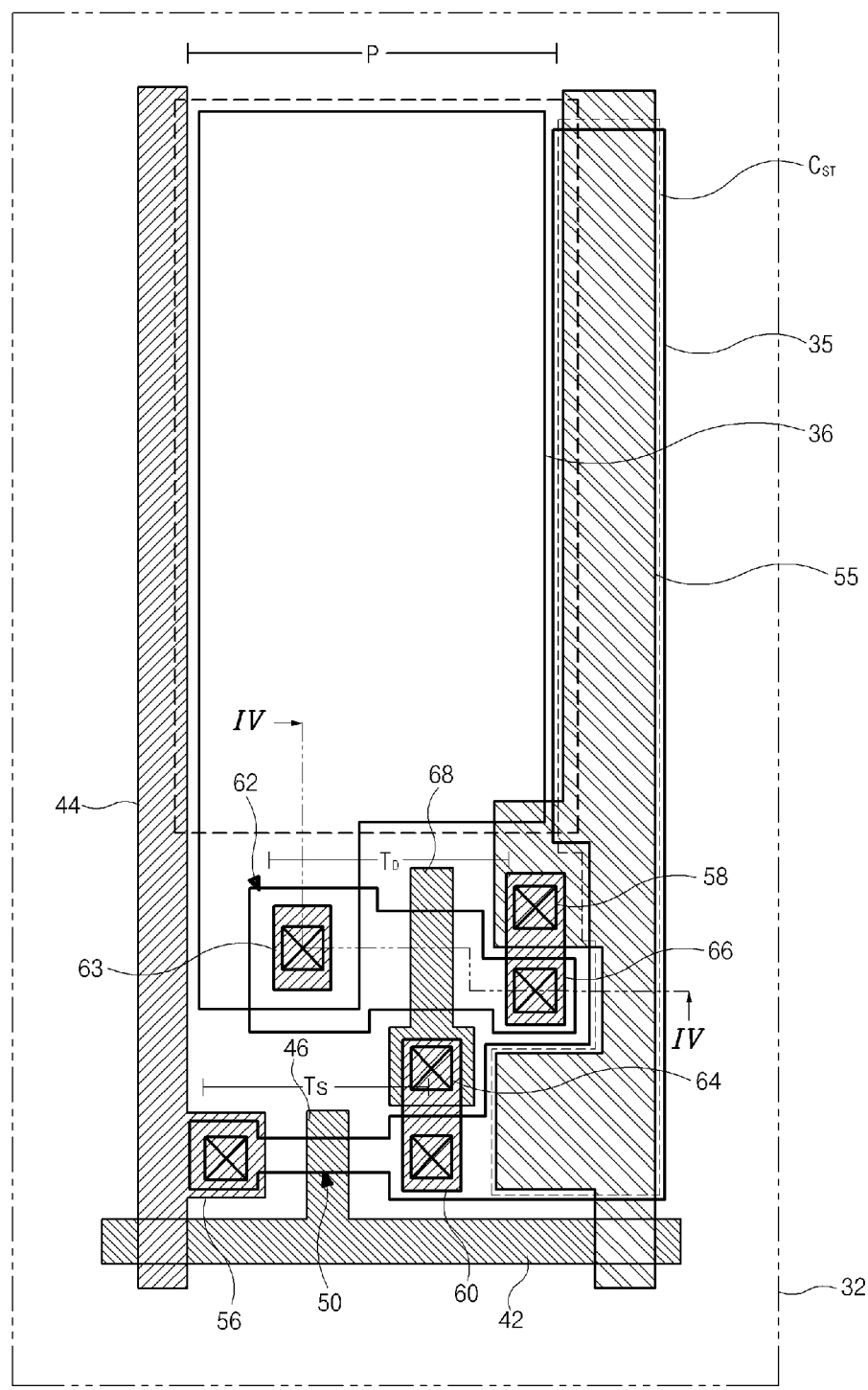
FIG. 3 is a schematic plan view of the related art OELD with a respect to one pixel region.
Figure 4:
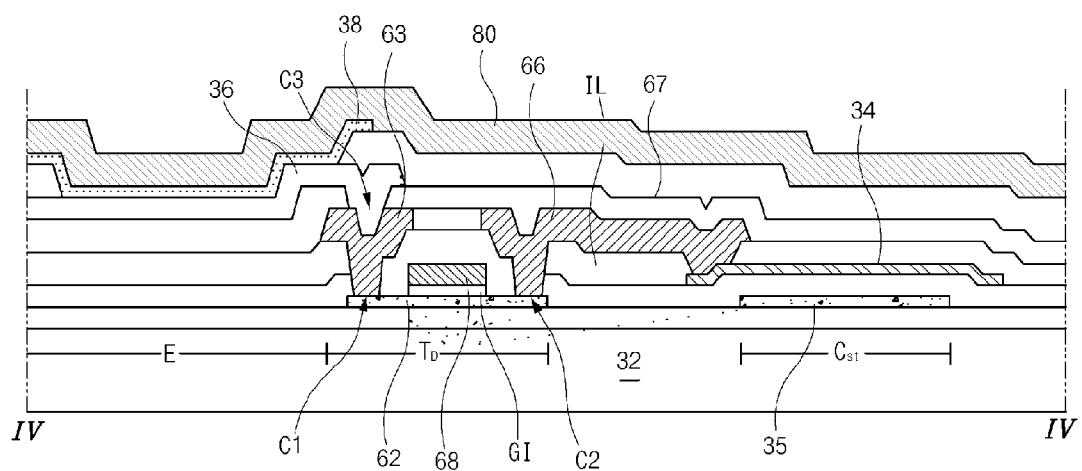
FIG. 4 is a schematic cross-sectional view of the related art OELD taken along the "IV-IV" line in FIG. 3.
Figure 5:
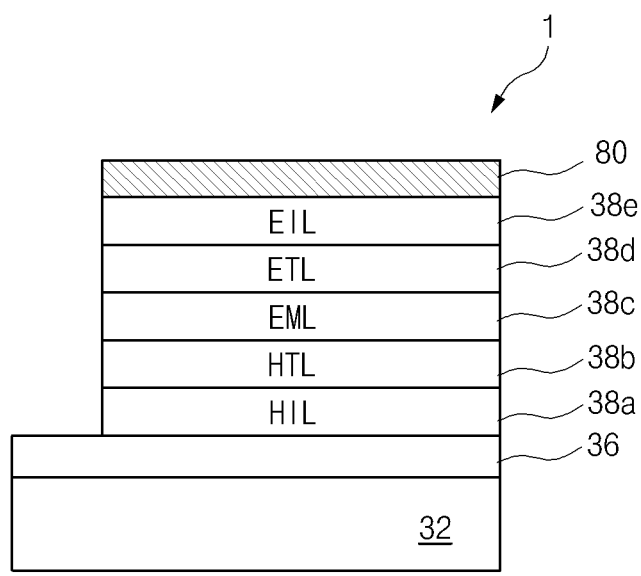
FIG. 5 is a schematic cross-sectional view of an emission region of the related art OELD.
Figure 6:
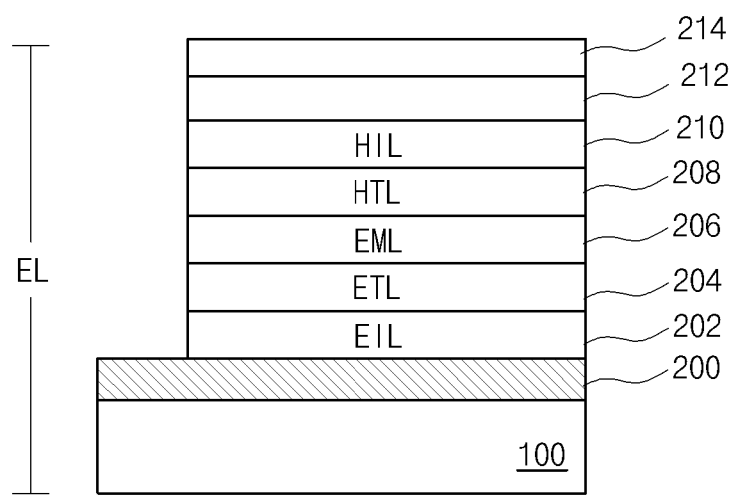
FIG. 6 is a schematic cross-sectional view of an OELD according to an embodiment of the present invention.

Turning first to FIG. 6, which is a schematic cross-sectional view of an OELD according to an embodiment of the present invention. As shown in FIG. 6, the OELD "EL" includes an array element (not shown) on a substrate 100, a cathode 200 on the array element, an electron injection layer 202 on the cathode 200, an electron transport layer 204 on the electron injection layer 202, an emitting layer 206 on the electron transport layer 204, a hole transport layer 208 on the emitting layer 206, a hole injection layer 210 on the hole transport layer 208, and an anode 214 over the hole injection layer 210.

Further, a buffer layer 212 may be disposed between the hole injection layer 210 and the anode 214 to prevent damage to the hole injection layer 210 during a deposition process by sputtering of the anode 214 of ITO or IZO. For example, the buffer layer 212 may include an organic molecular material for the hole injection layer. Specifically, the buffer layer 212 may be selected from one of an organic monomolecular material having a crystallinity and an oxide including vanadium pentoxide ($V_2O_5$). Also, the organic monomolecular material includes copper phthalocyanine (CuPc). Specifically, CuPc can be formed with a thin thickness and have a low threshold voltage and a high mobility.

In addition, the anode 214 includes a transparent conductive material such as ITO or IZO, and the cathode 200 includes molybdenum (Mo). Generally, although the cathode 200 is selected from a metallic material having a low work function such as calcium (Ca), aluminum (Al), magnesium (Mg), silver (Ag), or lithium (Li), the metallic material having a low work function is easily oxidized by being exposed to moisture and air during the mask process. Accordingly, the cathode 200 includes Mo having a non-oxidation characteristic or may further include a buffer layer between the cathode 200 and the electron injection layer 202. Specifically, the buffer layer may be etched when patterning a passivation layer (not shown) on the buffer layer to connect the cathode 200 and a drain electrode of the driving element "$T_D$."

As explained above, because the anode 214 is formed on top of the OELD, the OELD is a top emission type, thereby improving an aperture ratio. Also, although not shown, the cathode 200 is connected to a drain electrode of a driving element that is a negative type TFT, thereby reducing a number of manufacturing processing steps and thus the product cost. Furthermore, because the oxidation of the cathode 200 is prevented, process defects are prevented.

Figure 7:
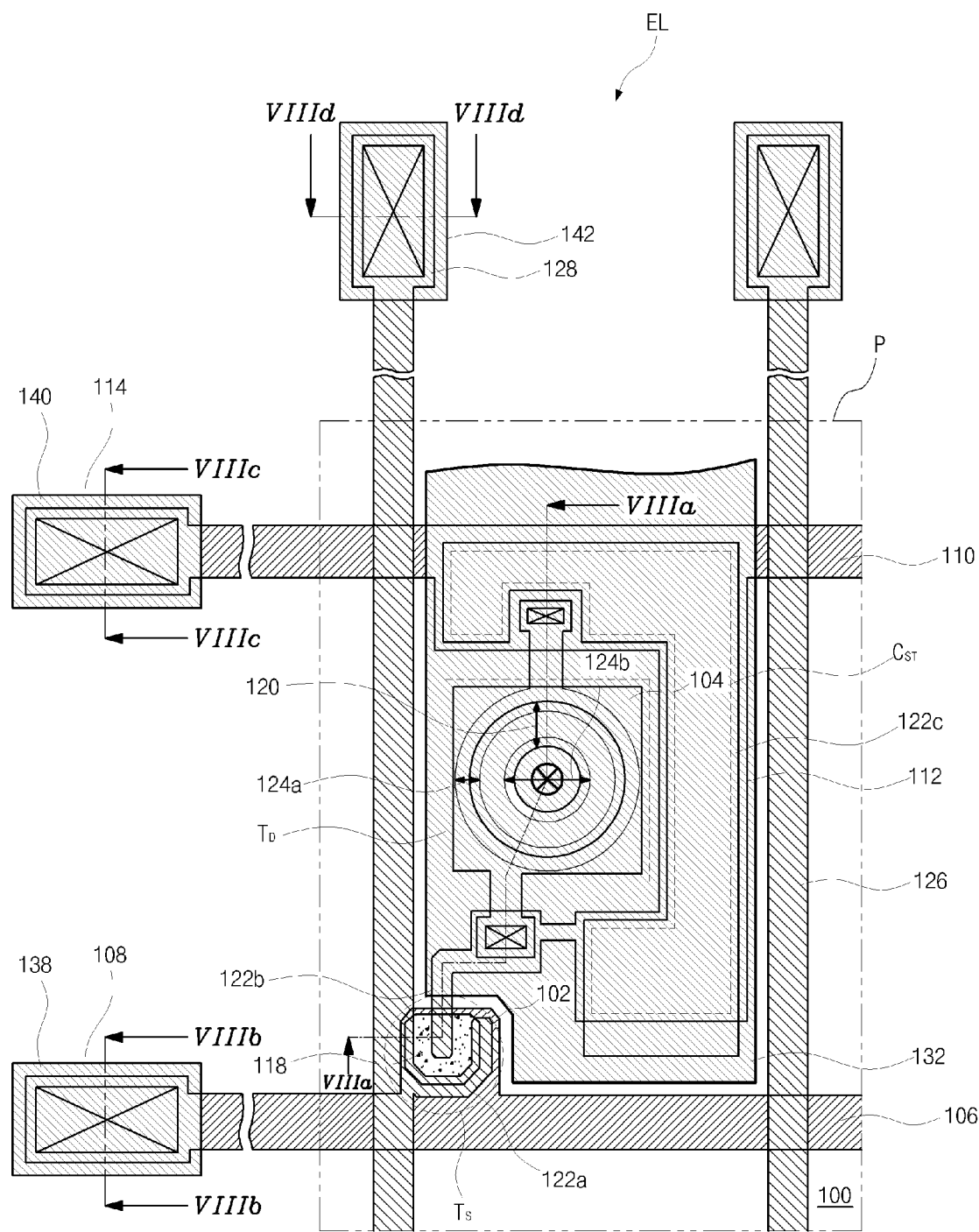
FIG. 7 is a schematic plan view of an array substrate of an OELD according to an embodiment of the present invention.

Next, FIG. 7 is a schematic plan view of an array substrate of an OELD "EL" according to an embodiment of the present invention. In FIG. 7, the switching element "Ts" and the driving element "$T_D$" connected the switching element "Ts" are formed on the substrate 100 in a pixel region "P."

The switching element "Ts" may be a negative thin film transistor including a first gate electrode 102, a first semiconductor layer 118, a first source electrode 122a, and a first drain electrode 122b. In addition, the driving element "$T_D$" is a negative thin film transistor including a second gate electrode 104, a second semiconductor layer 120, a second source electrode 124a and a second drain electrode 124b. Specifically, the driving element "$T_D$" is connected to the switching element "Ts" by connecting the second gate electrode 104 to the first drain electrode 122b.

Here, the first semiconductor and second semiconductor layers 118 and 120 include amorphous silicon, and the switching element "Ts" and the driving element "$T_D$" are formed as a structure to improve an operation characteristic of the OELD. For example, the first source electrode 122a has a "U" shape and the first drain electrode 122b has a bar shape extending into the first source electrode 122a and being spaced apart from the electrode 122a. Also, the second source electrode 124a has a ring shape and the second drain electrode 124b has a circular shape contained within and separated from the second source electrode 124a.

By the channel structures of the switching element "Ts" and the driving element "$T_D$," the channel length (not shown) is reduced and the channel width (not shown) is increased, thereby maximizing the channel width and minimizing the thermallization of the OELD.

In addition, a gate line 106 is formed on the substrate 100 along a first direction and is connected to the first gate electrode 102 to apply a scanning signal to the first gate electrode 102. A data line 126 crosses the gate line 106 to define the pixel region "P" and is connected to the first source electrode 122a to apply a data signal to the first source electrode 122a. In addition, a power line 110 is parallel to and is spaced apart from the gate line 106.

Further, a gate pad 108, a data pad 128 and a power pad 114 are formed at end portions of the gate line 106, the data line 126 and the power line 110, respectively. Furthermore, a gate pad terminal 138, a data pad terminal 142 and a power pad terminal 140 are connected to the gate pad 108, the data pad 128 and the power pad 114, respectively. For example, the gate pad terminal 138, the data pad terminal 142 and the power pad terminal 140 include a transparent conductive material such as indium tin oxide (ITO) or indium zinc oxide (IZO).

Meanwhile, although not shown, a storage capacitor "Cst" includes a first storage electrode extending from the first drain electrode 122b, a second storage electrode extending from the power line 110, and an insulating layer between the first storage electrode and the second storage electrode. In other words, the first storage electrode, the insulating layer and the second storage electrode are sequentially layered.

In addition, a cathode 132 as a first electrode is connected to the second drain electrode 124b. Although not shown, an emitting layer (not shown) is formed on the cathode 138 and an anode (not shown) is formed as a second electrode on the emitting layer.

Figure 8A:
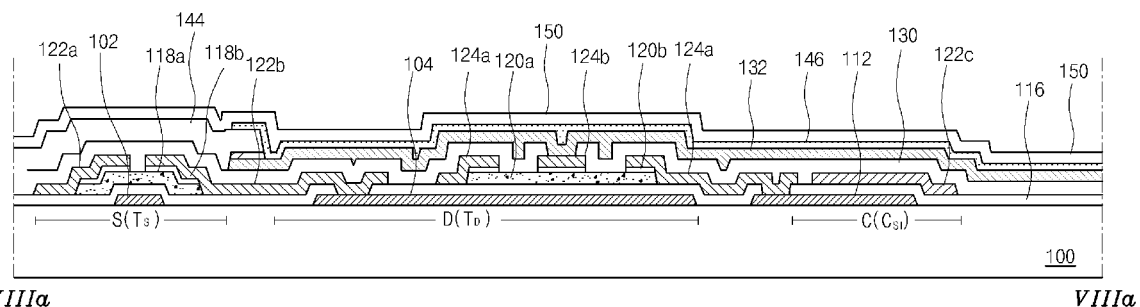
FIGS. 8A, 8B, 8C and 8D are schematic cross-sectional views of an OELD taken along the "VIIIa-VIIIa," "VIIIb-VIIIb," "VIIIc-VIIIc," and "VIIId-VIIId" lines in FIG. 7 according to an embodiment of the present invention.
Figure 8B:
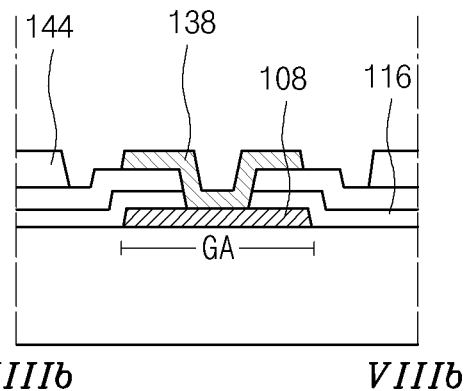
Figure 8C:
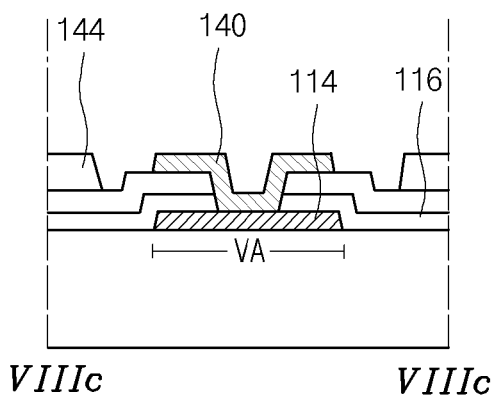
Figure 8D:
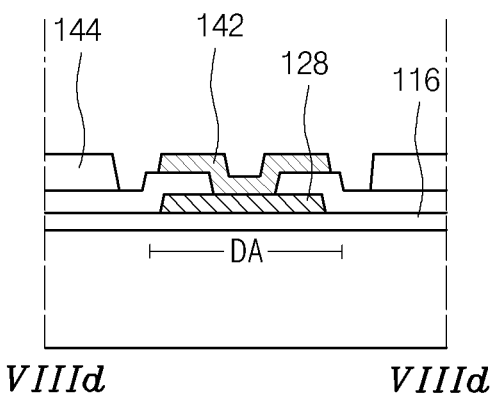

Next, FIGS. 8A, 8B, 8C and 8D are schematic cross-sectional views of an organic ELD taken along the "VIIIa-VIIIa," "VIIIb-VIIIb," "VIIIc-VIIIc," and "VIIId-VIIId" lines of FIG. 7 according to an embodiment of the present invention. In more detail, FIG. 8A illustrates a switching region "S," a driving region "D" and a storage region "C" defined on the substrate 100. FIGS. 8B, 8C and 8D illustrate a gate region "GA," a power region "VA" parallel to the gate region "GA," and a data region "DA" perpendicular to the gate region "GA" and the power region "VA," respectively.

As shown in FIG. 8A, the switching element "Ts" and the driving element "$T_D$" connected to the switching element "Ts" are formed in the switching region "S" and the driving region "D," respectively. Further, as discussed above with respect to FIG. 7 and as shown in FIG. 8A, the switching element "Ts" includes the first gate electrode 102, the first semiconductor layer 118, the first source electrode 122a, and the first drain electrode 122b. Further, the driving element "$T_D$" includes the second gate electrode 104, the second semiconductor layer 120, the second source electrode 124a, and the second drain electrode 124b. As shown in FIG. 7, the gate line 106 is formed along a first direction on the substrate 100, the power line 110 is parallel to and is spaced apart from the gate line 106, and the data line 126 crosses the gate line 106 to define the pixel region "P."

As not specifically shown in FIG. 8A, in the storage region "C," a first storage electrode extends from the first drain electrode 122b, and a second storage electrode extends from the power line 110. Further, a gate insulating layer 116 is disposed on the first storage electrode. In addition, as shown in FIG. 8A, the cathode 132 is connected to the second drain electrode 124b, an emitting layer 146 is formed on the cathode 132, and an anode 150 is formed on the emitting layer 146. In addition, the cathode 132 includes an opaque metallic material and the anode 150 includes a transparent conductive material. That is, the OELD "EL" is driven as a top emission type such that light from the emitting layer 146 is transmitted toward the anode 150.

Also, the second gate electrode 104 is connected to the first drain electrode 122b via a contact hole of the gate insulating layer 116, and the second source electrode 124a is connected to the power line 110 (shown in FIG. 7). Furthermore, a passivation layer 144 is formed on the cathode 128 at a boundary between the pixel regions "P," so the emitting layer 146 in each pixel region "P" is prevented from contacting each other.

Further, as shown in FIG. 7, the gate pad 108, the data pad 128 and the power pad 114 are formed at end portions of the gate line 106, the data line 126 and the power line 110, respectively. In addition, the gate pad terminal 138, the data pad terminal 142 and the power pad terminal 140 are connected to the gate pad 108, the data pad 128 and the power pad 114, respectively. FIGS. 8B, 8C and 8D illustrate in cross-sectional views the gate pad 108, the power pad 114, and the data pad 128, respectively.

Further, the cathode 132 includes molybdenum (Mo). Alternatively, a buffer layer (not shown) may be formed between the cathode 132 of a metallic material having a low work function and the emitting layer 146 in which the buffer layer includes molybdenum (Mo). In the latter case, the buffer layer is etched to expose the cathode 132 when the passivation layer 144 is patterned.

Turning next to FIGS. 9A-9G, 10A-10G, 11A-11G and 12A-12G, which are schematic cross-sectional views in accordance with a fabricating process of an OELD taken along the "VIIIa-VIIIa", "VIIIb-VIIIb", "VIIIc-VIIIc" and "VIIId-VIIId" lines in FIG. 7 according to an embodiment of the present invention. FIG. 7 will also be referred to in this description.

Figure 9A:
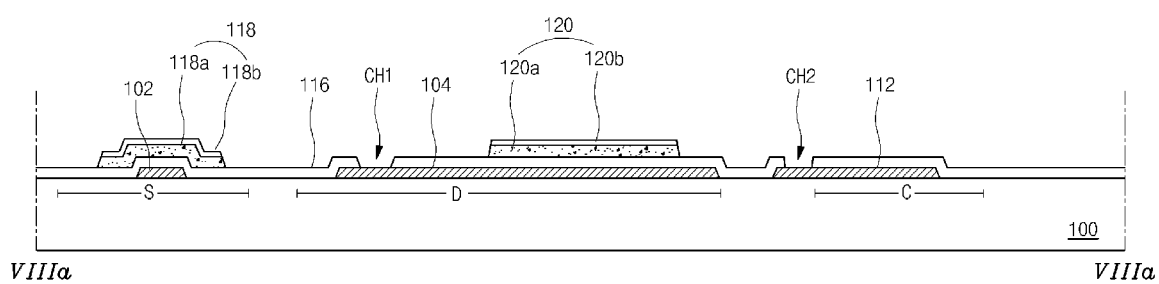
FIGS. 9A to 9G are schematic cross-sectional views in accordance with a fabricating process of an OELD taken along the "VIIIa-VIIIa" line in FIG. 7 according to an embodiment of the present invention.
Figure 10A:
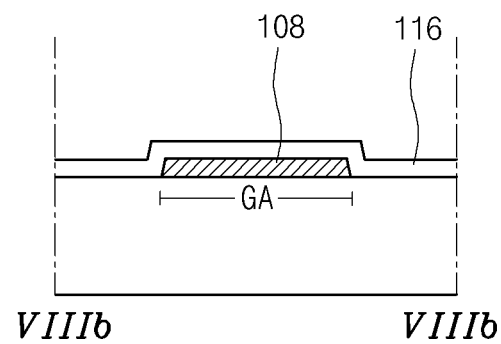
FIGS. 10A to 10G are schematic cross-sectional views in accordance with a fabricating process of an OELD taken along the "VIIIb-VIIIb" line in FIG. 7 according to an embodiment of the present invention.
Figure 10B:
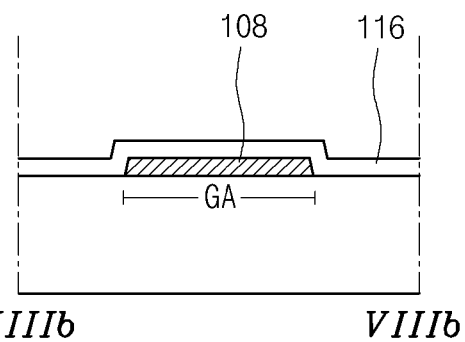
Figure 10C:
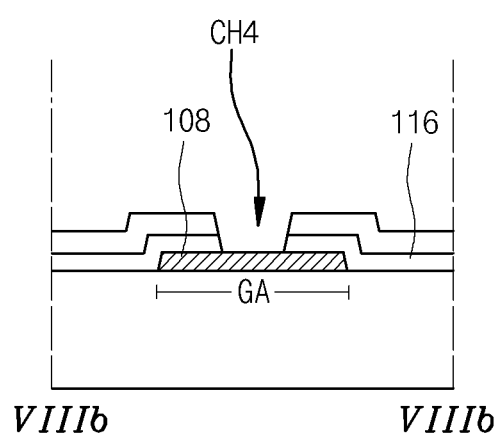
Figure 10D:
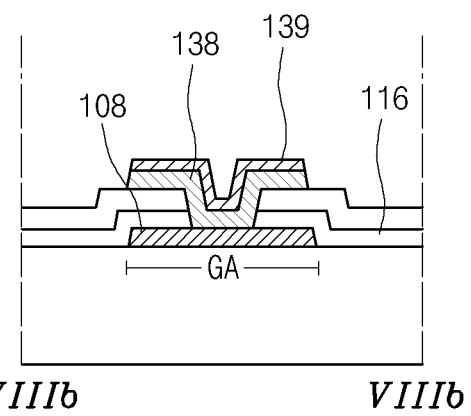
Figure 10E:
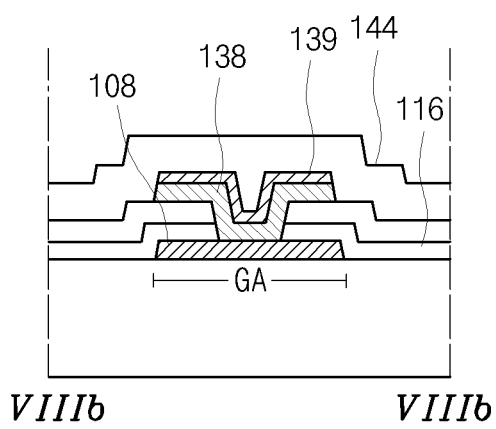
Figure 10F:
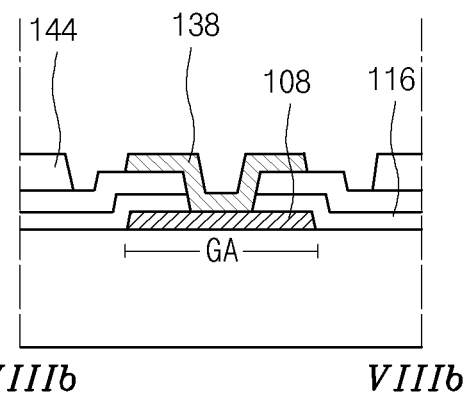
Figure 10G:
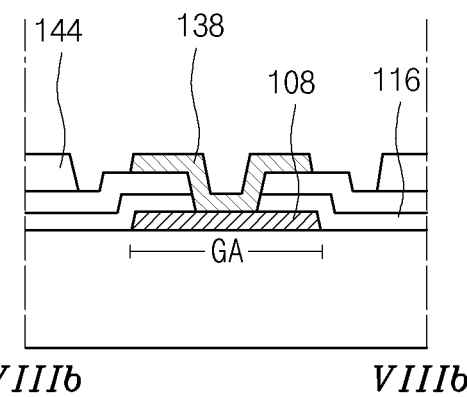
Figure 11A:
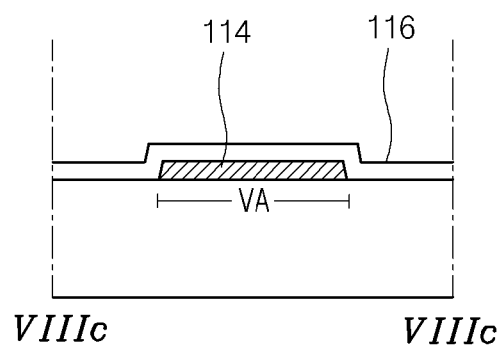
FIGS. 11A to 11G are schematic cross-sectional views in accordance with a fabricating process of an OELD taken along the "VIIIc-VIIIc" line in FIG. 7 according to an embodiment of the present invention.
Figure 11B:
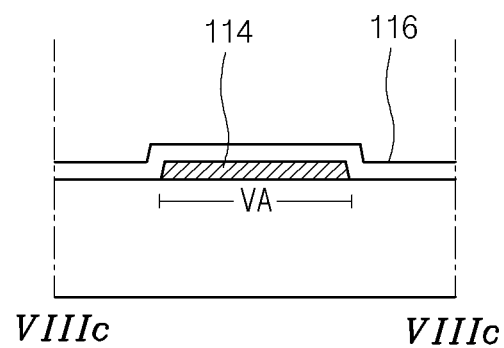
Figure 11C:
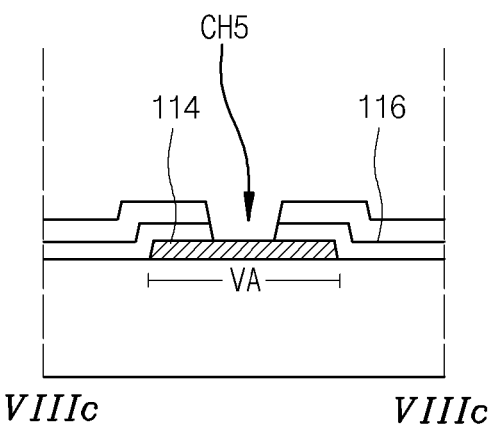
Figure 11D:
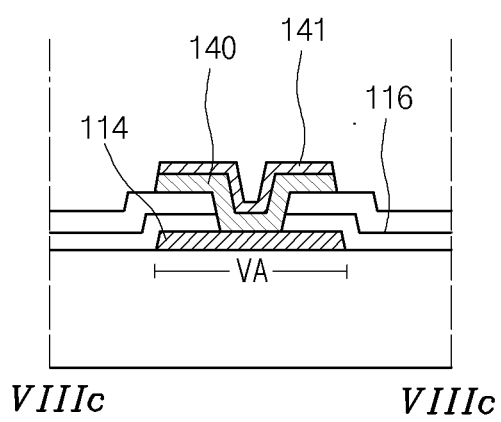
Figure 11E:
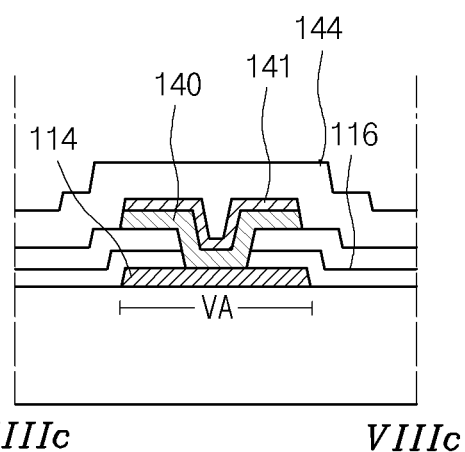
Figure 11F:
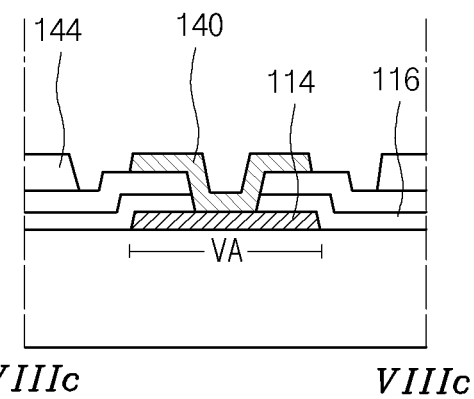
Figure 11G:
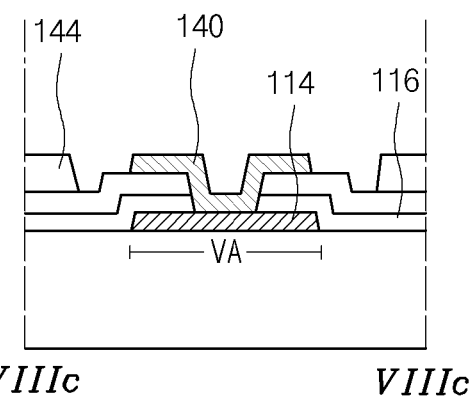
Figure 12A:
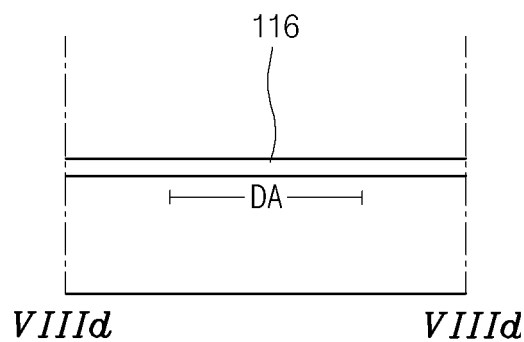
FIGS. 12A to 12G are schematic cross-sectional views in accordance with a fabricating process of an OELD taken along the "VIIId-VIIId" line in FIG. 7 according to an embodiment of the present invention.
Figure 12B:
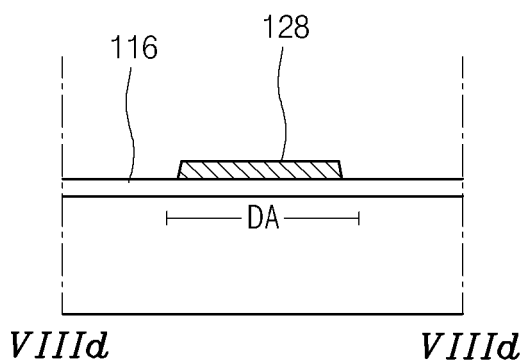
Figure 12C:
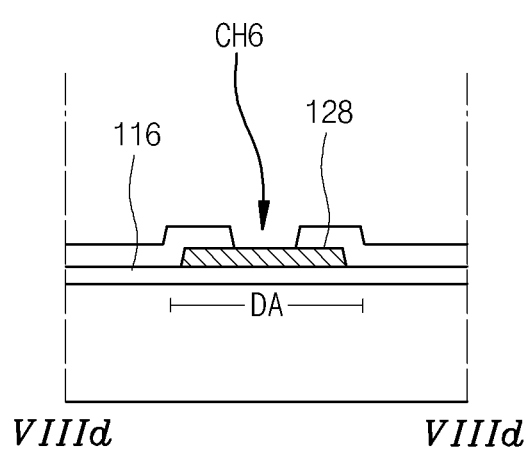
Figure 12D:
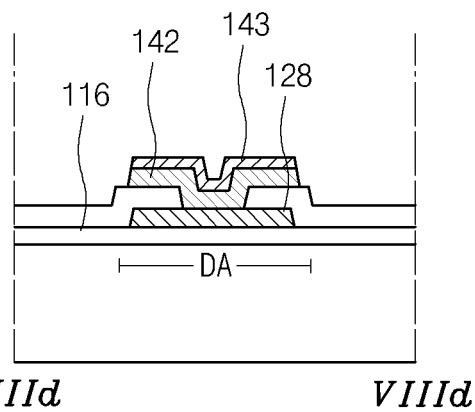
Figure 12E:
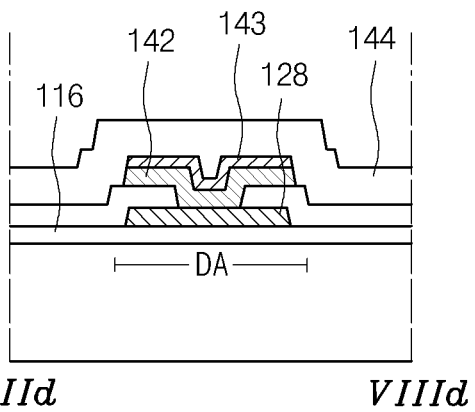
Figure 12F:
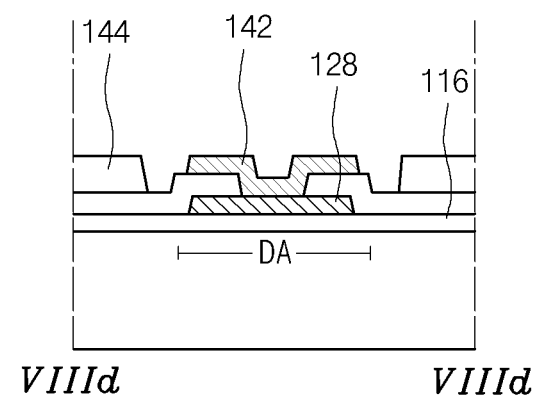
Figure 12G:
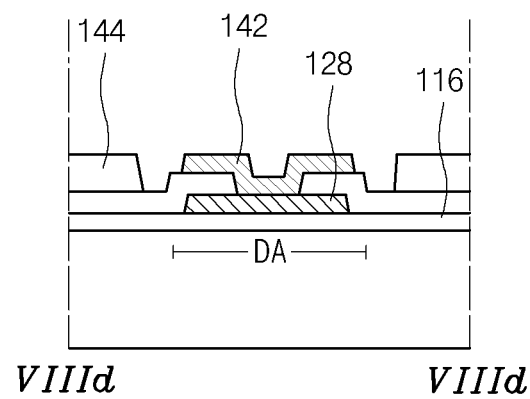

As shown in FIGS. 7 and 9A, the pixel region "P," the switching region "S," the driving region "D," and the storage region "C" are formed on the substrate 100. FIGS. 10A, 11A, and 12A illustrate the gate region "GA", the power region "VA," and the data region "DA," respectively. The data region "DA" and the gate region "GA" define the pixel region "P", and the power region "VA" is disposed at a region parallel to the gate region "GA." Further, as shown in FIG. 9A, the first and second gate electrodes 102 and 104 are formed by depositing and patterning a material including aluminum (Al), aluminum alloy such as aluminum neodymium (AlNd), chromium (Cr), Mo, copper (Cu), and titanium (Ti) in the switching region "S" and the driving region "D," respectively. In the gate region "GA," as shown in FIG. 7, the gate line 106 is connected to the first gate electrode 102 and is formed on the substrate 100, and the gate pad 108 is formed at end portion of the gate line 106. Further, the power line 110 is formed in the power region "VA," and the power pad 114 is formed at an end portion of the power line 110. The first storage electrode 112 extending from the power line 110 is formed in the storage region "C."

Next, as shown in FIGS. 9A, 10A, 11A and 12A, the gate insulating layer 116 is formed by depositing an inorganic insulating material such as silicon nitride (SiNx) or silicon oxide (SiOx) on the first gate electrode 102, the second gate electrode 104 and the second storage electrode 112. See also FIGS. 10B, 11B and 11C.

Next, first active and second active layers 118a and 120a are formed by depositing an intrinsic amorphous silicon on the gate insulating layer 116 in the switching region "S" and the driving region "D," respectively. Sequentially, first and second ohmic contact layers 118b and 120b are formed by depositing doped amorphous silicon on the first active and second active layers 118a and 120a, respectively. Here, the first active layer 118a and the first ohmic contact layer 118b constitute a first semiconductor layer 118, and the second active layer 120a and the second ohmic contact layer 120b constitute a second semiconductor layer 120.

Figure 9B:
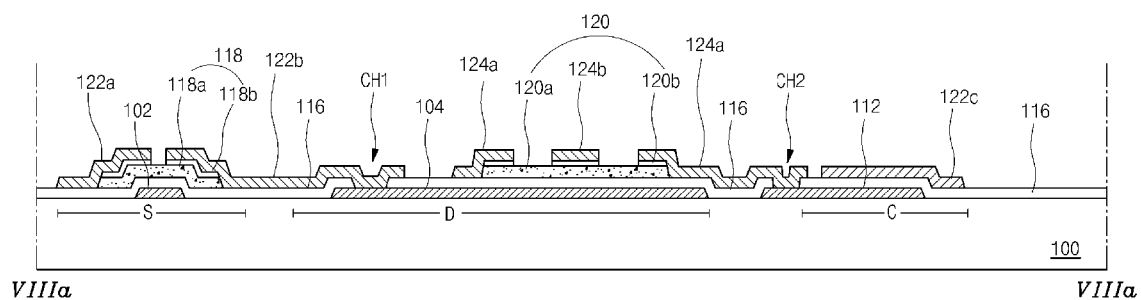

Next, as shown in FIG. 9A, first and second contact holes "CH1" "CH2" are formed by etching the gate insulating layer 116 to expose a portion of the second gate electrode 104 and a portion of the first storage electrode 112. As shown in FIG. 9B, the first source and first drain electrodes 122a and 122b, the second source and second drain electrodes 124a and 124b, and the data line 126 (of FIG. 7) are formed by depositing a conductive metallic material such as the same material as the gate line 106 in the switching region "S," the driving region "D" and the storage region "C," respectively. Further, the second storage electrode 122c extends from the first drain electrode 122b, the second gate electrode 104 is connected to the first drain electrode 122b via the first contact hole "CH1," and the second drain electrode 124b is connected to the second storage electrode 122c via the second contact hole "CH2."

Next, a portion of the first ohmic contact layer 118b between the first source electrode 122a and the first drain electrode 122b is removed to expose a portion of the first active layer 118a corresponding to the portion of the first ohmic contact layer 118b. Further, a portion of the second ohmic contact layer 120b between the second source electrode 124a and the second drain electrode 124b is removed to expose a portion of the second active layer 120a corresponding to the portion of the second ohmic contact layer 120b. Here, the exposed first active and second active layers 118a and 120a function as an active channel (not shown). In addition, as shown in FIG. 7, to reduce a channel length and to increase a channel width, the first source electrode 122a may have "U" shape and the first drain electrode 122b may be a bar shape. Alternatively, the second source electrode 124a may have a ring shape and the second drain electrode 124b may have a circular shape.

In addition, the first gate electrode 102, the first semiconductor layer 118, the first source electrode 122a, and the first drain electrode 122b constitute the switching element "Ts." Also, the second gate electrode 104, the second semiconductor layer 120, the second source electrode 124a, and the second drain electrode 124b constitute the driving element "$T_D$."

Figure 9C:
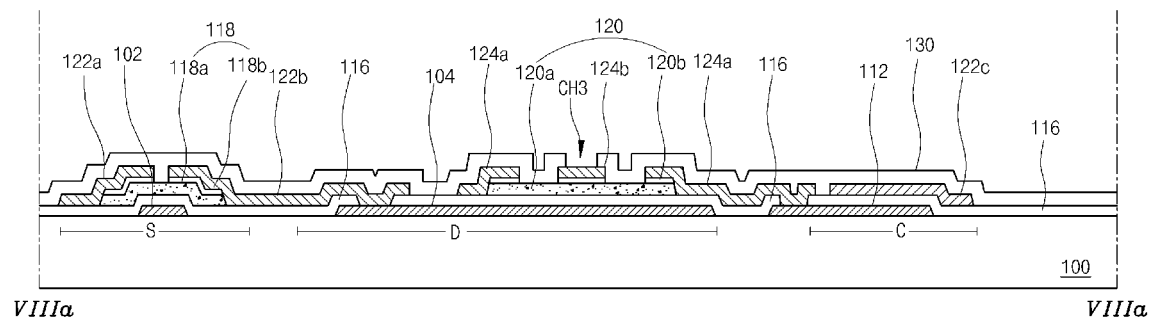

Next in FIG. 9C, the first passivation layer 130 is formed by depositing an inorganic insulating material on the switching element "Ts" and the driving element "$T_D$." In this step, a third contact hole "CH3" is formed by etching the first passivation layer 130 to expose a portion of the second drain electrode 124b. Simultaneously, fourth, fifth and sixth contact holes "CH4," "CH5," and "CH6" are formed by etching the first passivation layer 130 to expose portions of the gate pad 108, the power pad 114, and the data pad 128, respectively (see also FIGS. 10B, 11C and 12C).

Figure 9D:
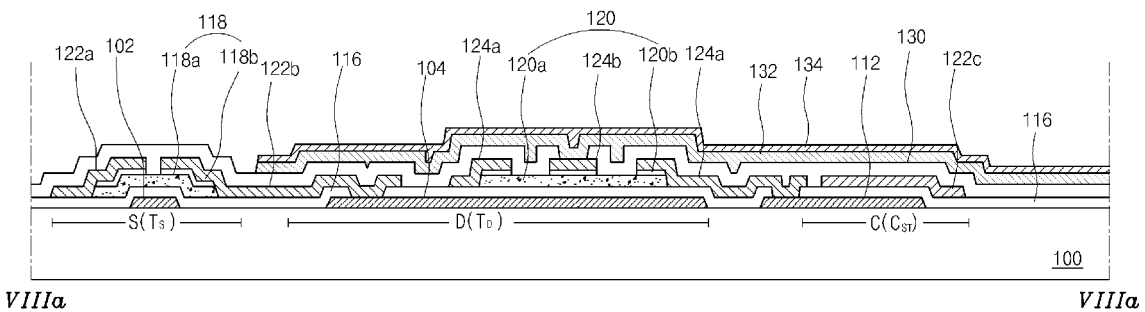
Figure 9E:
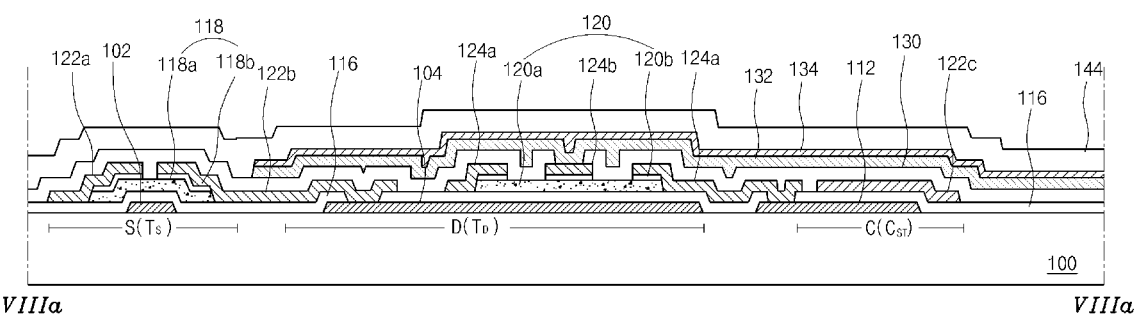
Figure 9F:
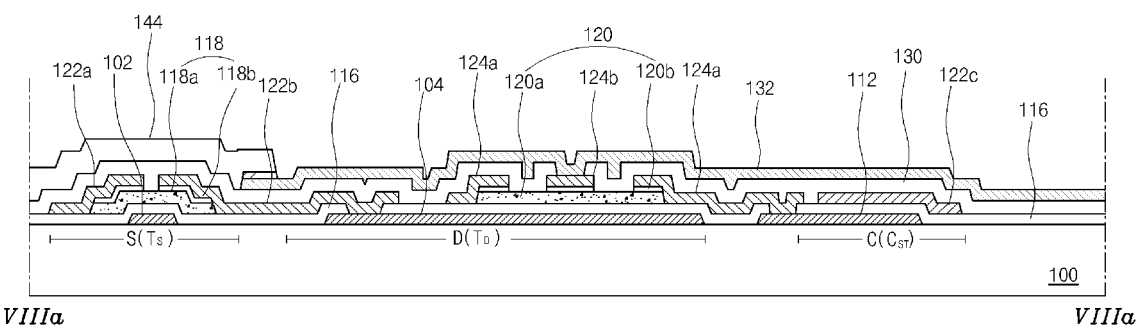

In FIG. 9D, the cathode 132 is formed by depositing one of calcium (Ca), aluminum (Al), magnesium (Mg), silver (Ag), and lithium (Li) on the driving element "$T_D$." Specifically, the cathode 132 is connected to the second drain electrode 124b via the third contact hole "CH3." In this step, the gate pad terminal 138, the power pad terminal 140, and the data pad terminal 142 are formed using the same material as that of the cathode 132 and the same material as that of the first buffer layer 134 on the gate pad terminal 138, the power pad terminal 140, and the data pad terminal 142, respectively. See also FIG. 11C.

Next, in FIGS. 9D, 10D, 11D and 11C, first, second, third and fourth buffer layers 134, 139, 141 and 143 are formed by depositing molybdenum (Mo) on the cathode 132, the gate pad terminal 138, the power pad terminal 140, and the data pad terminal 142, respectively.

Because the second, third and fourth buffer layers 139, 141 and 143 are etched through the fourth, fifth and sixth contact holes "CH4," "CH5," and "CH6," the gate pad terminal 138, the power pad terminal 140, and the data pad terminal 142 are connected to the gate pad 108, the power pad 114 and the data pad 128 via the fourth contact hole "CH4," the fifth contact hole "CH5" and the sixth contact hole "CH6," respectively. In FIGS. 9E, 10E, 11E and 12E, the second passivation layer 144 is formed by depositing an inorganic insulating material on the gate pad terminal 138, the power pad terminal 140, and the data pad terminal 142.

Next, in FIGS. 9F, 10F, 11F and 12F, the second passivation layer 144 is etched to expose the gate pad terminal 138, the power pad terminal 140, and the data pad terminal 142. Through this step, the second passivation layer 144 is remained at boundary between the pixel regions "P." Thus, because the first buffer layer 134 covers the cathode 132, oxidation reaction on the surface of the cathode 132 is not generated before patterning the second passivation layer 144. Similarly, the second, third and fourth buffer layers 139, 141 and 143 cover the gate pad terminal 138, the power pad terminal 140, and the data pad terminal 142, respectively. Therefore, the oxidation reaction is prevented.

Figure 9G:
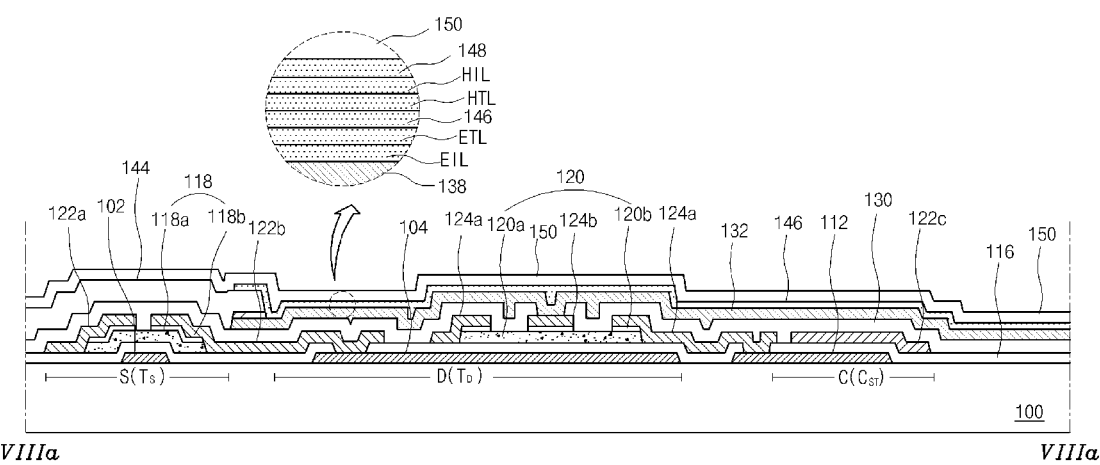

In FIGS. 9G, 10G, 11G and 12G, the emitting layer 146 is formed over the cathode 132. Further, as shown in FIG. 9G, the OELD includes the electron injection layer "EIL" on the cathode 132, the electron transport layer "ETL" on the electron injection layer "EIL," the hole transport layer "HTL" on the emitting layer 146, the hole injection layer "HIL" on the hole transport layer "HTL," and the second buffer layer 148 on the hole the injection layer "HIL." In addition, the emitting layer 146 includes red (R), green (G), and blue (B) sub-emitting layers. In each example, the emitting layer 146 is disposed in each pixel region "P."

Next, as shown in FIG. 9G, the anode 150 is formed by depositing and patterning a transparent conductive material such as indium tin oxide (ITO) or indium zinc oxide (IZO) on the second buffer layer 148. Thus, through the above-noted processes, the top emission type organic ELD is manufactured.

In addition, the OELD according to the present invention is an inverted structure such that a cathode of an opaque material is disposed as a lower electrode and an anode of a transparent conductive material is disposed as an upper electrode to form a top emission type OELD, thereby obtaining an improved aperture ratio without affecting the design of the array element. Further, the switching and driving elements are negative types, thereby reducing a number of processes, product cost, and increasing the stability of the circuit. More particularly, because the oxidation reaction of the cathode is prevented, a driving defect is also prevented.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:
1. An organic electroluminescent device, comprising:
a gate line on a substrate including a pixel region;
a power line parallel to and spaced apart from the gate line, the power line being formed at a same layer and of a same material as the gate line;
a data line crossing the gate line to define the pixel region;
a switching element and a driving element connected to the switching element, the switching element being connected to the gate and data lines, and the driving element being connected to the power line;
a cathode connected to the driving element;
a buffer layer on the cathode;
a passivation layer on the buffer layer, the passivation layer and the buffer layer having a contact hole that exposes a portion of the cathode;
an emitting layer on the passivation layer, the emitting layer contacting the cathode via the contact hole; and
an anode on the emitting layer,
wherein the buffer layer includes molybdenum (Mo).
2. The device according to claim 1, wherein the cathode includes a material selected from one of calcium (Ca), aluminum (Al), magnesium (Mg), silver (Ag), and lithium (Li).

3. A method of fabricating an organic electroluminescent device, comprising:

forming a gate line and a power line on a substrate including a pixel region, the power line being parallel to and spaced apart from the gate line, and the power line being formed at a same layer and of a same material as the gate line;

forming a data line crossing the gate line to define the pixel region;

forming a switching element and a driving element connected to the switching element, the switching element being connected to the gate and data lines, and the driving element being connected to the power line;

forming a cathode connected to the driving element after the step of forming the switching element and the driving element;

forming a buffer layer on the cathode;

forming a passivation layer on the buffer layer;

forming an emitting layer on the passivation layer, the emitting layer contacting the cathode via the contact hole that exposes a portion of the cathode; and forming an anode on the emitting layer.

4. The method according to claim 3, wherein the cathode includes a material selected from one of calcium (Ca), aluminum (Al), magnesium (Mg), silver (Ag), and lithium (Li).

5. The method according to claim 3, wherein the buffer layer includes molybdenum (Mo).

* * * * *